United States Patent [19]

Benbow

[11] 4,156,184

[45] May 22, 1979

[54] ON-PEAK WATTHOUR DEMAND METER HAVING COMPENSATION FOR DISC LOADING VARIATIONS

[75] Inventor: Eugene C. Benbow, Raleigh, N.C.

[73] Assignee: Westinghouse Electric Corp., Pittsburgh, Pa.

[21] Appl. No.: 911,593

[22] Filed: Jun. 1, 1978

[51] Int. Cl.² .......................................... G01R 11/64
[52] U.S. Cl. .................................. 324/103 R; 324/74
[58] Field of Search ................... 324/103 R, 74, 132, 324/116

[56] References Cited

U.S. PATENT DOCUMENTS 2,246,185  6/1941  Pratt .............................. 324/103 R Primary Examiner—Rudolph V. Rolinec
Assistant Examiner—Ernest F. Karlsen
Attorney, Agent, or Firm—R. W. Smith

[57] ABSTRACT

A timing motor of an on-peak demand meter is turned on only during maximum demand metering times. Torque aiding effects of the timing motor stray flux augment the meter disc torque to compensate for the intermittent demand gearing load.

6 Claims, 3 Drawing Figures

ON-PEAK WATTHOUR DEMAND METER HAVING COMPENSATION FOR DISC LOADING VARIATIONS

CROSS REFERENCE TO RELATED PATENT

This invention includes subject matter included in U.S. Pat. No. 4,128,807 issued Dec. 5, 1978 and assigned to the assignee of this invention.

BACKGROUND OF THE INVENTION

This invention relates to maximum watthour demand meters and more particularly to such meters having a novel arrangement for compensation of meter disc loading when the meter is operated between active and inactive states of demand metering.

In accordance with electric utility billing practices, maximum watt demand billing is often required in addition to billing for total electric energy consumption. For purposes of multi-rate metering, a watthour demand register may include plural sets of dial indicators for separately indicating consumption during different times of the day. Accordingly, an associated maximum demand indicator may be activated only during on-peak load times experienced by an electric utility distribution system. The use of the aforementioned register to is provide customer penalty billing for electric usage during on-peak times and to encourage electric power usage during off-peak periods.

In U.S. Pat. No. 3,913,014, issued Oct. 14, 1975 and assigned to the assignee of this invention, an on-peak demand meter is described and claimed. A timing mechanism in the demand meter register actuates a cam to establish off and on demand measuring times. The demand interval timing motor is required to continuously drive the timing mechanism although the demand indicating gear train is deactivated during the off demand measuring periods.

In U.S. Pat. No. 2,145,069, a two-rate watthour demand meter includes two watthour energy consumption registers and a maximum demand indicator which effects operation of one of the energy consumption registers only when the power demand exceeds a predetermined level. The demand metering mechanism is operated continuously with the current demand pointer being periodically reset at the end of each demand time interval.

In U.S. Pat. No. 2,246,185 a two-rate watthour meter device or a chart recording watt meter device are disclosed utilizing a voltage electromagnetic section of the watthour meter movement having an integral timing motor. The voltage coil simultaneously provides flux for the stator of the timing motor and for the voltage metering fluxes. The patent notes that it is customary to space or magnetically shield the timing motor and the meter mechanism so as to prevent stray fluxes from the motor magnetic circuit from interfering with the metering fluxes and the measurement accuracy. The timing motor is intended for continuous use and is designed so that the motor fluxes do not interfere or contribute to the metering fluxes.

Accordingly, it is desirable to provide a maximum demand watthour meter with a simple, inexpensive and reliable means for compensating variable loading on the meter disc with activation and deactivation of the maximum demand metering operation. The variable disc loads caused by the demand gearing being periodically engaged and disengaged from the meter disc shaft requires compensation in the disc driving torque to provide accurate watthour and maximum watt demand measurements when such measurements are made periodically or intermittently rather than continuously.

SUMMARY OF THE INVENTION

In accordance with the present invention an on-peak watthour demand meter includes a multi-dial register assembly having a continuously operated watthour gear assembly and a selectively operated on and off maximum demand gear assembly. An electrically actuated gear shift mechanism activates and deactivates the demand gear assembly. The mechanism is effective to couple and uncouple the maximum demand gear assembly from the driving rotation of a shaft supported disc assembly. The disc assembly is included in an electromagnetic metering movement so as to be driven in response to metering fluxes generated in accordance with variations of electric energy consumption to be measured. A demand interval timing motor drives a demand interval gear train within the demand gear assembly and the motor is effective to produce stray magnetic fields associated therewith to augment the metering fluxes driving the disc assembly. The motor stray magnetic fields increase the driving torque of the disc assembly by an amount substantially equal to the additional torque required to drive the demand gear assembly when it is activated. A switch control device concurrently energizes and deenergizes the gear shift mechanism and the timing motor so that the disc torque driving the watthour gear assembly remains substantially constant and provides improved accuracy in both the continuous watthour measuring indications and the periodic maximum power demand indications of the on-peak watthour demand meter.

It is a general feature of this invention to provide improved accuracy in the operation of an on-peak watthour demand meter by compensating for the periodic increase of meter disc loading when the maximum demand gear assembly is periodically activated and deactivated by utilizing the demand interval timing motor stray magnetic fields to augment the disc driving metering magnetic fields. It is a further feature of this invention to connect the polarities of the two coils forming the timing motor and a solenoid actuator of an on/off gear shift mechanism so that the stray magnetic fields thereof are produced in aiding relationship relative to the metering magnetic fluxes. It is a further feature that an on-peak demand register including the disc loading compensation feature can be interchanged with a conventional watthour or demand register mounted on a meter so that no new or recalibration of the watthour meter movement is required. It is a still further feature of this invention to decrease the electrical power loss of an on-peak watthour demand meter by deenergizing the timing motor when the demand gear assembly is deactivated thereby extending the service life of the timing motor by periodic operation rather than maintaining continuous operation. Another still further feature of this invention is to provide a solenoid actuator for an on/off demand gear shift mechanism and a demand interval timing motor having substantially equal coil impedances and a common operating voltage of 120 volts so that a single double pole, double throw switch device enables quick and simple connection of the coils in either series or parallel for energization from either of alternative 120 or 240 voltage sources supplying electric energy to be measured. Another still further feature of this invention is to provide common energization of the demand interval timing motor and the on-off gear shift mechanism solenoid actuator from one phase of a polyphase source of electric energy to be measured so that an outage of the one phase will not permit the metering fluxes of the remaining phases to continue to drive the maximum demand gear assembly upscale due to the absence of the timing motor driving connection to the demand metering pusher drive and reset mechanism.

Other features and advantages of the present invention will become apparent from the detail description of the drawings which are briefly described hereinafter.

DESCRIPTION OF THE PREFERRED EMBODIMENTS

Figure 1:
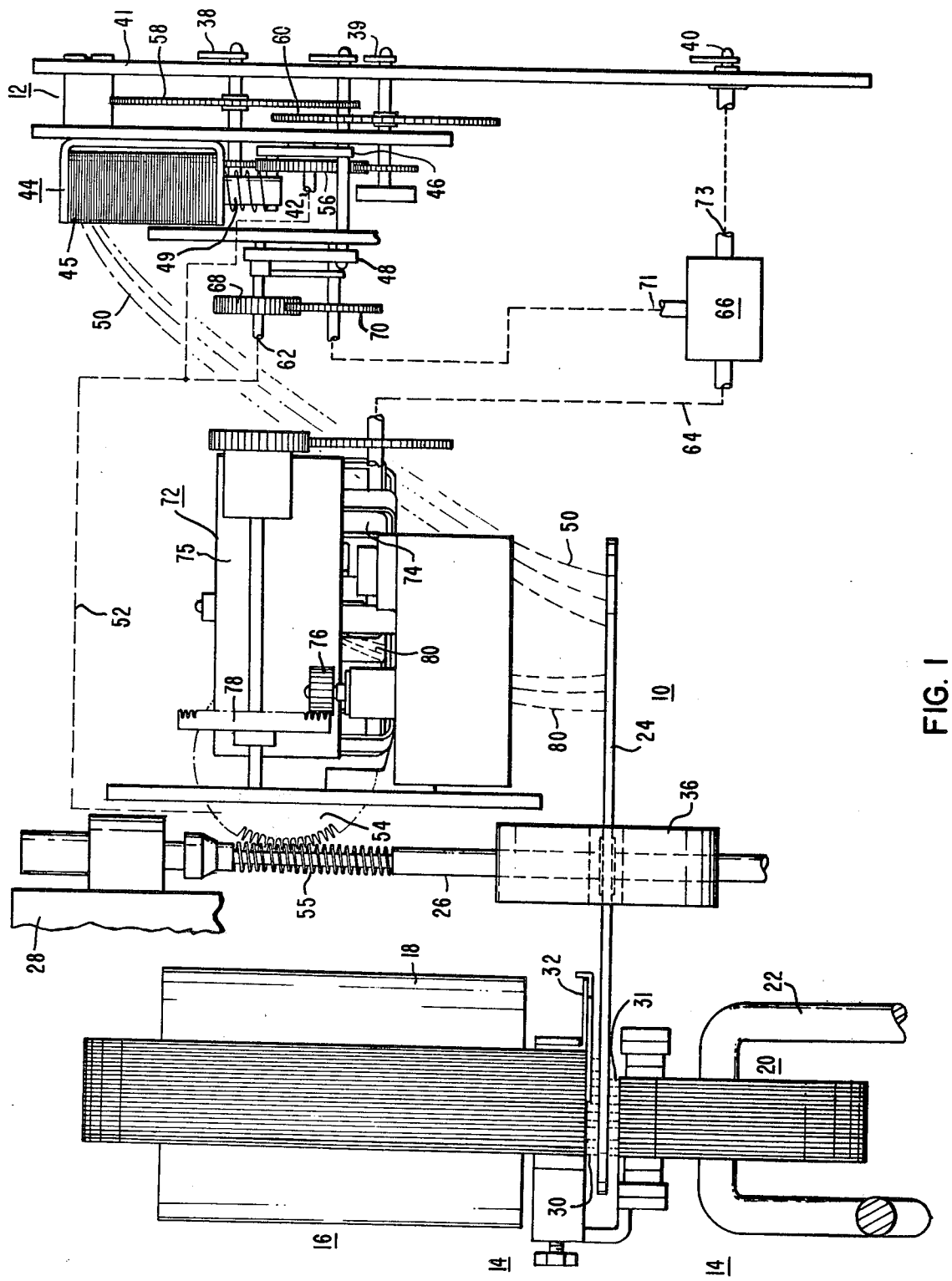
FIG. 1 is a side elevational view of an on peak watthour demand meter having meter disc torque compensation made in accordance with the present invention with a portion thereof shown in schematic form.

Referring now to the drawings and more particularly to FIG. 1, there is shown an on-peak watthour demand meter 10 having compensation for meter disc loading variations made in accordance with the present invention. A dial register assembly 12 is included in the meter 10 to be driven by a watthour meter movement 14 which may be of either the single phase or polyphase type disclosed in the U.S. Pat. Nos. 3,309,152 or 3,683,276, respectively, both assigned to the assignee of this invention. The meter movement 14 is an induction watthour meter type well understood by those skilled in the art of watthour meters as including a voltage electromagnet section 16 having a voltage responsive coil 18 and a current electromagnet section 20 having a current responsive coil 22. The meter movement 14 further includes a rotor assembly formed by an electroconductive disc 24 carried by a shaft 26 journaled for rotation in the meter frame 28, a fragmentary portion of the frame 28 being shown in FIG. 1.

The voltage and current coils 18 and 22, respectively, are connected to conductors, not shown, supplying electric power and energy quantities to be measured by the meter 10. The metering magnetic fields 30 and 31 produced by the voltage and current coils 18 and 22, respectively, are directed into the disc 24 so that it is driven electromagnetically in response to eddy currents developed therein in accordance with the operation of induction watthour meters. The torque and speed of rotation of the disc 24 is directly proportional to the voltage and current components of the electric power quantity connected to the voltage and current coils 18 and 22.

A light load adjuster 32 included in the voltage section 16 is of a type described in the the aforementioned Pat. Nos. 3,309,152 and 3,683,276 and also described and claimed in U.S. Pat. No. 3,493,862 for adjusting the magnitude of the load torque applied by the voltage and current electromagnetic sections to the rotor assembly including the disc 24. The meter movement 14 further includes a damping magnet 36 which directs a permanent magnet field through the disc 24 for providing eddy current damping in a manner well understood in the art.

The register 12 is detachably carried on the frame 28 in a manner not shown and has the same principal parts as described and claimed as the above cross referenced U.S. Pat. No. 4,128,807. Differences between the parts described in the aforementioned application and the corresponding parts which are modified and arranged to uniquely provide the novel operation of the present invention are particularly described hereinbelow.

The register 12 generally includes a two-rate watthour measuring assembly and an on-off maximum watt demand measuring assembly. The invention is not limited for use with such two-rate watthour measuring assemblies, it being understood that the important aspect is that the register 12 provides a continuous indication of electric energy consumption at one or more dial indicators or pointers 38 and 39. Maximum watt demand indicator pointers 40 are associated with a single set of on-peak maximum power demand dials also provided on the dial plate 41 of register 12.

To provide the on and off maximum power demand measurements and the alternate electric energy consumption measurements by the pointers 38 and 39, a gear shift mechanism 42 is provided. As also described in the above-identified application, the gear shift mechanism 42 includes an electrical solenoid actuator 44 including a coil 45 for pivotally moving the first and second shifting control plates 46 and 48. A plunger 49 of the solenoid actuator 44 is operative between an extended unenergized position and a retracted energized position so as to only activate the off-peak watthour pointers 39 or alternatively the on-peak watthour pointers 38 and the watt demand pointers 40. As described further hereinbelow, in one embodiment the solenoid actuator coil 45 has associated therewith a stray magnetic field 50 effective to augment the metering magnetic fields 30 and 31 and electromagnetically driving the disc 24 by a predetermined amount.

The watthour measuring assembly included in the register 12 includes a register input gear train 52 having an input formed by a worm wheel 54 driven by the worm 55 on the disc shaft 26. The gear train 52 has an output gear 56 carried by the shifting control plate 46 so as to be effective to mesh with either of the dial gear trains 58 and 60 which, in turn, are drivingly associated with the pointers 38 and 39 respectively. The input gear train 52 continuously drives either of the dial gear trains 58 or 60, depending upon the energized or deenergized state of the solenoid actuator 44. Thus, the rotational torque produced by the disc 24 is always required to provide the continuous indications of the measured electrical energy consumption through the watthour measuring assembly of the register 12.

The maximum watt demand measuring assembly of the register 12 generally includes a demand indicating gear train 62, a demand interval gear train 64 and a pusher drive and reset mechanism 66 which is, for example, as described in U.S. Pat. No. 3,460,338. The input to the demand indicating gear train 62 includes a second output gear 68 of the register input gear train 52. A movable gear 70 is operated by the second shifting control plate 48 to engage and disengage the gear 68 in response to the energized and deenergized states of the solenoid actuator 44. The gear 70 provides the demand indicating input 71 to the pusher drive and reset mechanism 66. The output 73 of the demand indicating gear train 62 is coupled from the mechanism 66 to the on-peak maximum watt demand pointers 40.

The demand interval gear train 64 provides preselected demand intervals or time periods, for example, every fifteen, thirty or sixty minutes to operate the pusher drive and reset mechanism 66. As described in the last-named U.S. Pat. No. 3,460,338, the mechanism 66 is effective through a pusher arm and follower arm, not shown, to drive the pointers 40 upscale when the measured power demand of a given demand interval is higher than any previously measured power demand. The pusher arm is reset to a zero or starting position at the end of each demand interval by the mechanism 66. To provide the timed operation required for establishing the demand intervals in the demand interval gear train 64, a timing motor 72 is included in the register 12. The timing motor 72 is a hystersis type of synchronous timing motor having a stator coil 74, rotor 75 and an output spur gear 76. A crown gear 78 provides the input to the demand interval gear train 64 and is rotated by the motor output gear 76 when the motor is energized.

The timing motor 72 is energized in accordance with the descriptions of the circuit shown in FIGS. 2 and 3 hereinbelow to provide motor operation and driving input to the gear train 64. The motor coil 74 has associated therewith a stray magnetic field 80. In accordance with an important feature of the present invention, the stray motor field 80 is effective to electromagnetically produce an increase in driving torque of the disc 24 in addition to that produced by the metering magnetic fields 30 and 31. It is believed that a portion of the motor stray magnetic field 80 directly induces eddy currents in the disc 24 which interact with the induced eddy currents produced by the metering magnetic fields 30 and 31 to produce additional torque in the disc 24. It is further believed that a portion of the stray motor flux 80 may be coupled to the voltage coil 18, which typically includes a large number of coil turns, to increase the magnetic field 30 and the disc torque produced by the voltage electromagnetic section 16.

The amount of additional torque required by the disc 24 to drive the demand indicating gear train 62, when it is activated by the gear shift mechanism 42 through the gears 68 and 70, is provided by the motor stray magnetic field 80 in one preferred embodiment and by both the stray magnetic fields 80 and 50 in another preferred embodiment so that the accuracy of the meter 10 remains substantially the same in both the on-peak and off-peak modes of operation. If the additional disc loading is not compensated by the stray fluxes, the rotation of the disc 24 will be slightly retarded when the demand measuring assembly is activated, thereby decreasing the speed of the active one of the watthour indicating dial gear trains 58 or 60. Thus, for the same electric power quantity being measured by the meter 10, a different speed is produced when the demand indicating gear train is active from that speed which is produced when it is inactive, without the compensating feature of the present invention.

In conventional watthour demand meters intended for continuous operation rather than on and off operation as in the present invention, the interfering or stray magnetic fields produced by the demand interval timing motor must be taken into account in calibration of the meter movement. The polarity of the motor coil is connected so that the motor stray magnetic field has an aiding effect on the meter disc torque to cancel the added disc load due to the additional gear train load. Typically, two tenths to four tenths percent (0.2% to 0.4%) disc torque increase is provided in such conventional watthour demand meters. In the present invention, 0.2% to 1% compensation may be required. When the aforementioned calibrations are made, the meter movement must be calibrated again if the demand register is replaced with a register not having demand gearing and a timing motor. Alternatively, magnetic shields are provided, where effective, to prevent the stray magnetic fields from interfering or changing the speed or torque of the meter disc.

Figure 2:
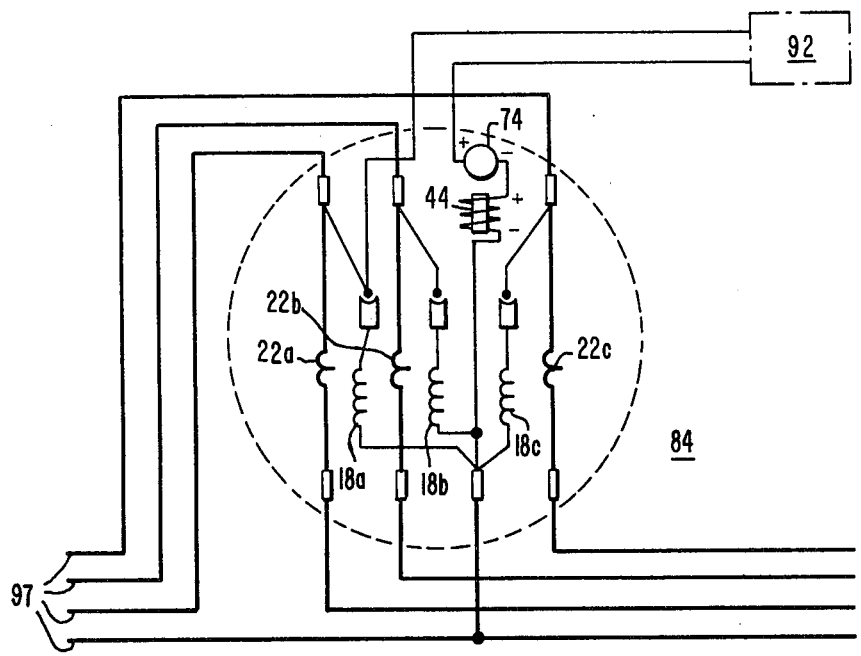
FIG. 2 is an electrical schematic diagram of a polyphase on peak watthour demand meter including one form of the invention shown in FIG. 1.
Figure 3:
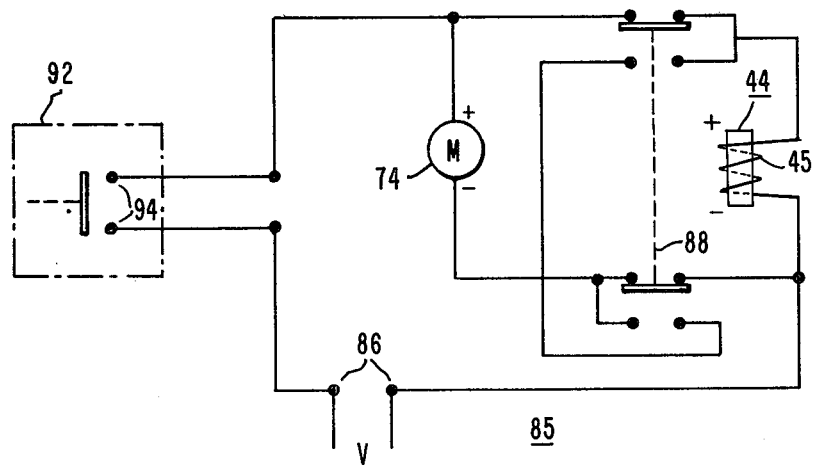
FIG. 3 is an electrical schematic diagram of an alternative manner of connecting a demand interval timing motor and solenoid actuator included in FIG. 1.

Referring now to FIGS. 2 and 3, there are shown electrical circuit diagrams 84 and 85, respectively, for connecting the solenoid actuator 44 and the coil 74 of motor 72 to sources of energization. It is normally desirable to energize the motor 72 and the actuator 44 from the same sixty hertz power being measured by the meter 10. Since meters are often connected to either of 240 or 120 volt distribution systems, it is desirable to provide the same parts for energization from either of the two power line distribution voltages. In FIG. 3 there is shown an electrical circuit 85 having a pair of terminals 86 for connecting to either 120 or 240 volt distribution systems to be measured by the meter 10. A double pole double throw switch 88 is effective to connect the motor coil 74 and the solenoid actuator coil 45 in either series or parallel with the supply terminals 86. The impedance of the motor coil and the solenoid coil are provided to be substantially equal and intended for energization at 120 volts and sixty hertz. The polarity markings at the motor coil 74 and solenoid coil 45 are to indicate that the connections are to be made so that the stray flux thereof is to be produced in a disc torque aiding relationship.

With the switch positioned as shown in FIG. 3 the motor coil 74 and the solenoid actuator coil 45 are connected in parallel for enerization from a 120 volt source. When the other position of the switch is made, the motor coil 74 and solenoid actuator 44 are connected in series for energization from a 240 volt source. With the series connection, the impedance of the motor coil and solenoid coil being substantially equal, a substantially equal voltage drop of 120 volts will be produced across each coil for its intended operation.

In order to control the on and off operation of the meter 10, a switch control device 92 is provided, the control device 92 is effective to connect and disconnect the voltage source supplied at the pair of terminals 86 to the motor coil 74 and solenoid actuator coil 45. The switch control device 92 may be provided by a time switch which periodically closes the switch contacts 94 during predetermined times each day which correspond to the on-peak power demand periods experienced by the distribution system supplying the power at the point at which the meter 10 is connected. Such time control switches are well known and examples are described in U.S. Pat. Nos. 2,217,414 and 2,300,513. Alternatively, the on and off switching may be provided by a remote control indication system utilizing either radio or power line carrier and effective to address a particular meter location and produce actuation of the switch contacts 94. One such device is disclosed and claimed in U.S. Pat. No. 4,130,874, issued Dec. 19, 1978, and assigned to the assignee of this invention, wherein a load management terminal is described for receiving remote communication signals and effecting switch contact openings and closings in response to remote communication signals.

FIG. 2 illustrates a polyphase watthour metering circuit 84 forming one form of an on-peak watthour demand meter shown in FIG. 1. The metering circuit 84 includes three voltage and current electromagnetic sections including voltage coils 18a, 18b and 18c and three current coils 22a, 22b and 22c corresponding to the voltage and current coils 18 and 22 shown in FIG. 1. The metering movement may be as described in the aforementioned U.S. Pat. No. 3,683,276. The motor coil 74 and solenoid actuator 44 are connected as shown in FIG. 2 in series with the switch control device 92, described hereinabove and between one phase and neutral of the polyphase power line conductors 97. The switch control device 92 periodically energizes the motor coil and solenoid actuator to perform the on-peak demand measurements when the watt demand measuring assembly of the meter is activated and to deenergize the motor and solenoid actuator to deactivate the watt demand measuring assembly.

The circuit 84 in FIG. 2 has a further advantage when measuring the watt demand of a polyphase distribution system since the solenoid actuator and timing motor are concurrently energized across one phase to neutral connection of the conductor 97. If there is an outage of the phase connected to the meter current coil 22a and the voltage coil 18a, also energizing the motor coil 74 and solenoid actuator coil 45, the motor coil 74 will be deenergized but the solenoid actuator 44 will also be deenergized to return the meter to the off-peak or inactive demand metering operational mode. In conventional watthour demand meters a failure of the one phase also supplying the meter timing motor prevents the pusher drive and reset mechanism, as shown in FIG. 1 from resetting and returning the associated pusher arm. The remaining two phases of the conductors 97 will cause the demand indicators to continue to be moved upscale and to the upper limit of the scale and thereby give an erroneous indication of the peak demand. Accordingly, an outage of the phase supplying the timing motor does not permit the continued operation of the demand measurements and the last maximum demand indication measured by the meter will be maintained until the outage of the phase is restored. An outage of any of the other phases will not affect the demand meter reading since the timing motor will be energized by the remaining phases and continue to reset the meter mechanism at the end of each demand interval.

Briefly reviewing the operation of the meter 10 shown in FIG. 1 and connected as shown in either FIGS. 2 or 3, the stray magnetic fields 50 and 80 are produced by the motor coil 74 and/or solenoid actuator coil 45 so as to have an increased disc driving effect in addition to the metering magnetic fields 30 and 31 produced by the voltage and current sections 16 and 20. It is believed that the stray flux 80 from the motor 72 contributes substantially more disc torque increase than does the stray flux 50 from the solenoid actuator 44. The actuator 44 is positioned more forward and further above the disc 24 than is the timing motor 72. The compensating effect of the stray magnetic fields is calibrated by the light load adjuster 32 when the meter is calibrated in accordance with established watthour metering calibration techniques. When the switch control device 92 deenergizes the solenoid actuator 44 and the timing motor 72, the watthour measuring assembly as described hereinabove is activated and driven by the rotation of the disc 22 solely in response to the voltage and current metering fluxes 30 and 31 produced by the voltage and current electrical magnet sections 16 and 20. When the switching device 92 energizes the solenoid actuator 44 and timing motor 72, the gear shift mechanism 42 is effective to change the disc drive to the on-peak watthour dial gear train 58 and the associated pointers 38 continue to indicate the measured electric energy consumption. The mechanism 42 activates the watt demand measuring assembly so as to couple the demand indicating gear train, through the gears 68 and 70 so that the disc is driving the pusher arm portion of the pusher drive and reset mechanism 66. The disc torque is increased or augmented by an amount equal to the additional loading on the disc 22 and associated shaft 26 due to the additional torque required to drive the watt demand measuring assembly. Accordingly, changes in the load driven by the disc shaft 26 during the on-peak and off-peak modes of operation is compensated to provide and maintain the same degree and accuracy and measurement by the meter 10 in both modes of operation. It is contemplated that the solenoid actuator 44 may only be momentarily energized or pulsed and the on-peak position of the gear mechanism 42 may be mechanically detented. Thus, the solenoid coil stray flux would not have significant effect on the disc 24.

While preferred embodiments of the present invention have been described hereinabove, it will be apparent to those skilled in the art that other modifications and changes may be made without departing from the spirit and scope of this invention.

I claim:
1. An on-peak watthour demand meter comprising:
   a shaft supported electroconductive metering disc member;
   a watthour meter movement for producing voltage and current metering magnetic fluxes effectively to electromagnetically produce driving rotations of said disc member;
   watthour gear train means driven by the disc member rotations for indicating the consumption of electric energy;
   maximum demand indicating gear train means driven by said disc member rotations for indicating maximum electric power demand;
   demand interval gear train means operatively coupled to said maximum demand indicating gear train means;
   a timing motor drivingly connected to said demand interval gear train means, said timing motor producing stray magnetic fields effectively to electromagnetically increase the torque produced by the disc member rotations by a predetermined amount substantially equal to the load of said maximum demand indicating gear train means on said disc member;
   gear shaft means for coupling and uncoupling said maximum demand indicating gear train means from the driving rotations of said disc member; and
   switch means for connecting and disconnecting said timing motor to a source of energization concurrently when said gear shift means couples and uncouples, respectively, said maximum demand indicating gear train means to the disc rotations.
2. An on-peak watthour demand meter as claimed in claim 1 wherein said gear shift means includes solenoid actuator means for effecting the coupling and uncoupling operations thereof, and wherein said solenoid actuator means is connected by said switch means so as to be concurrently connected and disconnected from a source of energization with said timing motor.

3. An on-peak watthour demand meter as claimed in claim 2 wherein the watthour meter movement is connected to a source of polyphase electric power and wherein one phase of the polyphase electric power is connected through said switch means to said timing motor and said solenoid actuator.

4. An on-peak watthour demand meter as claimed in claim 2 wherein said timing motor includes a stator coil and the solenoid actuator includes a solenoid coil with both of the coils having substantially the same impedance and operable by a common value of voltage.

5. An on-peak watthour demand meter as claimed in claim 4 including a double pole double throw switch for alternately connecting said coil of said timing motor and said coil of said solenoid actuator in parallel and series relationship with said switch means and a source of energization.

6. An on-peak watthour demand meter as claimed in claim 2 wherein said solenoid actuator produces stray magnetic fields effective to further increase the torque of said disc member so that the increased torque effects of both of the stray magnetic fields of said timing motor and of said solenoid actuator produce said predetermined amount of additional torque.

* * * * *